United States Patent
Dyer

(10) Patent No.: US 6,209,483 B1
(45) Date of Patent: Apr. 3, 2001

(54) APPARATUS AND METHOD FOR REMOVING SILICON DIOXIDE RESIDUES FROM CVD REACTORS

(75) Inventor: Timothy Scott Dyer, Tempe, AZ (US)

(73) Assignee: Accord S. E. G., Tempe, AZ (US)

( * ) Notice: Subject to any disclaimer, the term of this patent is extended or adjusted under 35 U.S.C. 154(b) by 0 days.

(21) Appl. No.: 09/305,619

(22) Filed: May 5, 1999

Related U.S. Application Data

(63) Continuation-in-part of application No. 09/041,171, filed on Mar. 12, 1998, now abandoned, which is a continuation-in-part of application No. 08/730,849, filed on Oct. 17, 1996, now abandoned.

(51) Int. Cl.$^7$ ................................................. C23C 16/00
(52) U.S. Cl. ........................ 118/723 R; 118/723 ME; 134/104.1
(58) Field of Search ............................... 134/1, 1.1, 1.2, 134/1.3, 2, 104.1, 902; 118/620, 639, 723 R, 723 ME

(56) References Cited

U.S. PATENT DOCUMENTS

| | | | |
|---|---|---|---|
| 4,563,367 | * | 1/1986 | Sherman . |
| 4,581,101 | * | 4/1986 | Senoue . |
| 5,174,856 | * | 12/1992 | Hwang . |
| 5,266,153 | * | 11/1993 | Thomas . |
| 5,300,460 | * | 4/1994 | Collins . |
| 5,626,775 | * | 5/1997 | Roberts . |

* cited by examiner

Primary Examiner—Richard Bueker
(74) Attorney, Agent, or Firm—Herbert M. Shapiro

(57) ABSTRACT

CVD reactors can be cleaned at surprisingly high rates using Non-Green House gases by employing the Non-Green House gases at high temperatures and with relatively high fluorine free radical concentrations so long as high concentrations of oxygen are also used to compensate for the detrimental effects of the high temperatures and free fluorine radical concentrations. Net oxide residue etch rates approximately 2,800 times greater than etch rates achieved with controlled Green House gases can be achieved. This is done by employing a pre-ionization module upstream of the reactor to be cleaned to generate the requisite high density plasma.

1 Claim, 2 Drawing Sheets

APPARATUS AND METHOD FOR REMOVING SILICON DIOXIDE RESIDUES FROM CVD REACTORS

REFERENCE TO RELATED APPLICATIONS

This patent application is a continuation in part (CIP) of application Ser. No. 09/041,171 filed Mar. 12, 1998, now abandoned which is a CIP of application Ser. No. 08/730,849 filed Oct. 17, 1996, now abandoned.

FIELD OF THE INVENTION

This invention relates to a method for removing silicon dioxide residues in chemical vapor deposition (CVD) reactors and more particularly to techniques for cleaning plasma enhanced chemical vapor deposition (PECVD) oxide, nitride and thermal tungsten thin film reactors.

BACKGROUND OF THE INVENTION

Plasma Etching of silicon dioxide residues in CVD reactors is dominated by fluorine ions and free radicals (F neutrals). CF neutral radicals can also enhance etching of oxide residues but their effect is an order of magnitude less. As $SiO_2$ is etched, $SiF_3$ and $SiF_4$ gas molecules are produced at the $SiO_2$ surface. These silicon containing gasses leave the $SiO_2$ surface and are pumped out of the system. Higher overall gas flows and lower reactor pressures assist in this etching process by aiding in the removal of these gasses. In addition, free fluorine production in a PFC plasma is directly related to the presence of oxygen in the glow discharge. Carbon in the PFC gas species is oxidized to form CO or $CO_2$. Etch rate data for $CF_4$ plasmas indicate that 12–16 atomic % of oxygen is required to achieve maximum $SiO_2$ oxide removal rates ($C_2F_6$ plasmas required about 30–50% oxygen). Oxygen deficient PFC plasmas tend to generate polymeric residues on the surfaces of components inside the reactor. $SiO_2$ etching rates decline rapidly on components covered with these polymeric residues (eventually the $SiO_2$ etching rate will be dominated by the ashing rate of the oxygen neutrals in the plasma, not the ability of the fluorine neutrals to attack the $SiO_2$). Conversely, if the oxygen concentration in the plasma is increased too much, the plasma will become diluted (the relative fluorine content will drop), therefore $SiO_2$ residue etch rates will decrease. Addition of hydrogen to $PFC/O_2$ plasmas reduces $SiO_2$ residue etch rates by tying up free fluorine radicals in the form of HF vapor. An artifact of this hydrogen effect is to increase the relative carbon to fluorine ratio of the discharge, therefore enhancing polymer generation. As more and more hydrogen is added to the reactor cleaning plasma, polymer production increases (20 atomic % hydrogen in a $CF_4/O_2$ plasma will stop oxide etching) and eventually the $SiO_2$ etch rate is reduced to zero.

Concurrently, $CF_4/O_2$, $CF_4/N_2O$, $C_2F_6/O_2$, and $NF_3$/AR plasmas are used for PECVD oxide, nitride, and thermal tungsten thin film reactor cleaning. These gasses are presently on the EPA's list of controlled green house gasses (they are subject to strong controls in the near future). However $C_2F_5H$ and $CF_3H$ are not considered controlled green house gasses by the EPA since they lack the chemical stability of their PFC counterparts (they are unable to reach the upper atmosphere and remain there long enough to damage the ozone layer). Reactor cleaning with these hydrogen containing gases is slower due to increased polymerization. In order to compensate for polymerization when using these gasses in reactor cleaning plasmas, additional oxygen must be added to the plasma (this also dilutes the plasma). In order to improve the cleaning rates of $C_2F_5H$ and $CF_3H$ one needs to increase the fluorine radical concentration in the discharge without increasing the flow rate of the hydrogenated PFC gas to increase the efficiency of the plasma in its ability to generate fluorine radicals. In addition, heating the process gas upstream of the chamber could also increase the etching rate of residue of films in the reactor. This is illustrated by the following equation from Lieberman, M. A. and Lichtenberg, A. J. Principles of Plasma Discharges and Materials Processing, John Wiley and Sons, Pub. 1994.:

$$E_rSiO_2 \, (\text{Å/min}) = 0.61 \times 10^{-12} \eta_{fs} T^{1/2} e^{-1892/T}$$

Where $E_rSiO_2$ is the oxide residue etch rate, $\eta_{fs}$ is the fluorine radical concentration, and T is the surface reaction temperature in Kelvins.

BRIEF DESCRIPTION OF THE INVENTION

Applicant has found that residue etch rates increase proportionally with fluorine free radical concentration and exponentially with temperature. For example, if the fluorine radical concentration in a 400 degree Centigrade $C_2F_5H$ discharge is increased by 100 times and 20% additional oxygen is added to compensate for the C to F ratio of the hydrogenated PFC, the net oxide residue etch rate would be approximately 2800 times greater than a $C_2F_6/O$ discharge using a 25 degree Centigrade feedstock gas with a nominal fluorine radical concentration. In order to increase the fluorine free radical concentration of the plasma and feedstock temperature, a high density plasma dual ionization plasma source is employed herein for the capacitive clean discharge. High density plasmas have ion (and neutral) densities as high as $10^{12}$ per $cm^3$ vs. $10^9$ per $cm^3$ for a traditional capacitive discharge.

Thus, the invention is based on the recognition that relatively high concentrations of oxygen can be used to compensate for any detrimental effects of elevated carbon and hydrogen concentrations or high temperatures in the above formula. Further, in accordance with the principles of this invention $C_2F_5H$ and $CF_3H$ gasses are used for CVD reactor cleaning by using an elevated fluorine radical concentration, and elevated temperature and a relatively high percentage of oxygen to achieve residue etch rates approximately 2,800 times greater than that achieved with a $C_2F_6/O$ capacitive discharge using a 25 degree Centigrade feedstock gas with a nominal fluorine radical concentration. The desired fluorine free radical concentration and feedstock temperature are provided by a high density plasma ionization source for the capacitive plasma.

DETAILED DESCRIPTION OF AN ILLUSTRATIVE EMBODIMENT OF THIS INVENTION

Figure 1:
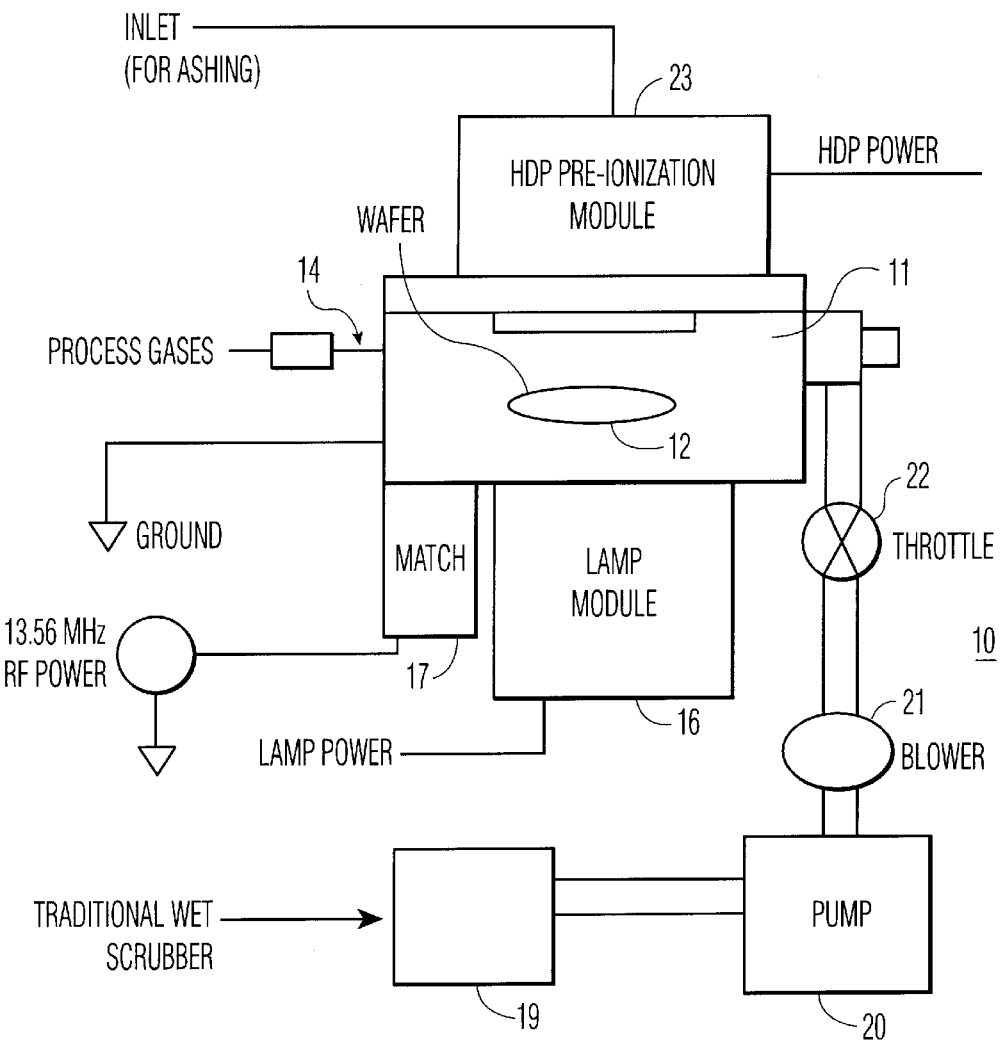
FIG. 1 is a block diagram of an illustrative apparatus for cleaning CVD reactors in accordance with this invention.

FIG. 1 shows a block diagram of a Non-Green House gas plasma processing apparatus 10. The apparatus comprises a CVD plasma chamber 11 in which a wafer 12 is placed for processing. The apparatus also comprises the standard components for such apparatus including a processing gas inlet 14, a lamp module 16 with a power source, a match 17 with a 13.56 MHZ RF power source; and a traditional wet scrubber 19 with a pump 20, a blower 21, and throttle 22. But in accordance with the principles of this invention, an HDP pre-ionization source 23 is connected to the CVD chamber for introducing the Non-Green House gases at the required elevated temperature and with the required fluorine free radical concentration and elevated oxygen concentration.

Figure 2:
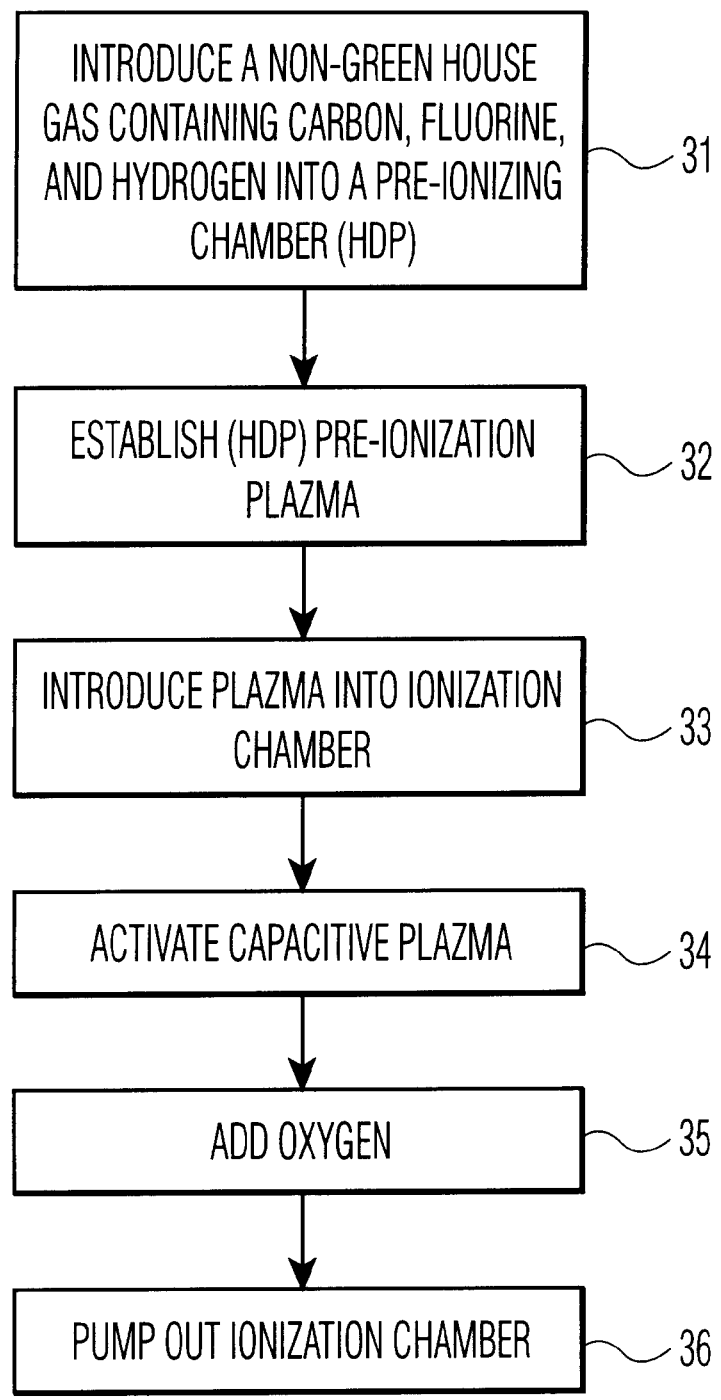
FIG. 2 is a flow diagram of the method practiced by the apparatus of FIG. 1.

FIG. 2 is a flow diagram of the method practiced with the apparatus of FIG. 1. The method comprises the steps of introducing a Non-Green House gas containing carbon, fluorine and hydrogen such as $C_2F_5H$ and $CF_3H$ into a pre-ionization chamber. This step is represented by block 31 in FIG. 2. The next step is to establish a plasma in the chamber to generate fluorine free radicals on the order of a hundred times higher than the concentrations with such gases in prior art usage thereof as represented by block 32 in FIG. 2.

The next step is to introduce the plasma into the ionization chamber to be cleaned as indicated by block 33. The plasma is then activated as indicated by block 34.

The next step is to introduce oxygen into the chamber in sufficient quality to prevent any polymerization due to the presence of hydrogen in the chamber as represented by block 35.

The final step is to pump out of the chamber silicon containing gases as represented by block 36.

In one specific embodiment, the fluorine radical concentration is increased one-hundred times in a 400 degrees Centigrade $C_2F_5H$ discharge and twenty percent additional oxygen is added to compensate for the new carbon to fluorine ratio (see the above equation) of the hydrogenated PFC. The net oxide residue etch rate is about twenty-eight hundred times greater than that achieved in a conventional capacitive $C_2F_5/O$ discharge using a 25 degrees Centigrade feedstock gas with a nominal fluorine concentration.

The fluorine free radical concentration of the plasma and elevated feedstock temperature is achieved conveniently by the use of a high density plasma dual ionization plasma source for the capacitive clean discharge. High density plasmas have ion (and neutral) densities as high as $10^{12}/cm^3$ verses $10^9/cm^3$ for traditional capacitive discharge.

The following table is a process comparison of the standard PFC clean and the enhanced HDP-HPFC clean process in accordance with the principles of this invention:

| Process Comparison: STD PFC Clean and Enhanced HDP-HPFC Clean | | |
|---|---|---|
| Process Parameter | Standard PFC clean | HDP Enhanced HPFC Clean |
| $O_2:C_2F_6$ Ratio | 1.0:1.0 | N/A |
| $O_2:CF_4$ Ratio | 1.0:5.0 | N/A |
| $O_2:C_2F_5H$ Ratio | N/A | 3.0–4.0:1.0 |
| $O_2:CHF_3$ | N/A | 4.0–5.0:1.0 |
| Process Pressure | 1.0 to 5.0 Torr | 0.5–2.0 Torr |
| RF Power | 3–4 Watts/cm$^2$ | 3–4 Watts/cm$^2$ |
| HDP (ECR) Power | N/A | 500–1000 Watts |
| $N_2$ Flow | 0–400 sccm | 200–1000 sccm |
| $O_2$ Flow | 400–700 sccm | 600–2000 sccm |
| PFC or HPFC Flow | 600–900 sccm | 200–400 sccm |
| Ion Density | 1 × 10$^9$/cm$^3$ | 1 × 10$^{11}$/cm$^3$ |

| -continued | | |
|---|---|---|
| Process Comparison: STD PFC Clean and Enhanced HDP-HPFC Clean | | |
| Process Parameter | Standard PFC clean | HDP Enhanced HPFC Clean |
| Gas Temperature | 338 K | 450–550 K |
| Susceptor Temp. | 400° C. | 400° C. |
| Showerhead Temp. | 175° C. | 225° C. |
| Residue Etch Rate | 4000–6000 Å/min | 50000–100000 Å/min |

Applicant's invention is directed at a CVD reactor with a secondary plasma source mounted to introduce $C_2H_5F$ gas in a specified form and in sequence with the upstream plasma source of the reactor.

Specifically, applicant's specification (page 4, line 3 et seq.) explains that increased fluorine ion and neutral densities, along with additional heat from the upstream plasma source, results in an increased rate of the chamber cleaning process. The equation an applicant's page 3, line 9 is referenced to demonstrates that the silicon dioxide etch rates are dependent on ion concentration and temperature.

In addition, running the plasma in series generates a relatively high amount of heat and provides an even faster etching than a decoupled system. Further, if a pre-ionization source were moved further from the main reactor than required by the applicant significant ionic recombination would occur prior to the gasses entering the reactor. Recombination reduces both ionic and neutral concentrations in the reactor being cleaned thus reducing the cleaning rate of $SiO_2$ residue inside the reactor. The placement and operation of applicant's pre-ionization chamber is a key feature of applicant's invention.

The use of a secondary plasma source according to the invention permits better fractionation of the $C_2F_5H$ molecule and achieves a 100 times higher fluorine ion density than can be achieved with any method other than that disclosed and claimed by the applicant. In addition, applicant's arrangement achieves the level of heat required to increase oxide residue etch rates (per the equation on applicant's page 3). Etch rate polymers tend to vaporize at temperatures over 150° Centigrade. Applicant's inventive apparatus is the only practical way to use $C_2F_5H$ for cleaning reactors.

What is claimed is:

1. Apparatus for cleaning a chemical vapor deposition chamber, said apparatus including said chemical vapor deposition chamber to be cleaned and pre-ionization module connected to said chamber, said module being capable of producing ion densities of up to $1\times10^{11}/cm^3$, said apparatus including a source of $C_2F_5H$ gas coupled to said module and means for operating said module in a manner to introduce into said chamber said gas with a fluorine radical concentration in the range of from $5\times10^{10}$ molecules/$cm^3$ to $1\times10^{12}/cm^3$ at a temperature in a range of from 100 degrees to 400 degrees centigrade and with an oxygen concentration in a range of from 15% to 50% said apparatus including a source of said oxygen concentration coupled to said chamber.

* * * * *